United States Patent
Lee et al.

(10) Patent No.: US 6,911,386 B1
(45) Date of Patent: Jun. 28, 2005

(54) INTEGRATED PROCESS FOR FUSE OPENING AND PASSIVATION PROCESS FOR CU/LOW-K IMD

(75) Inventors: Tze-Liang Lee, Hsinchu (TW); Chao-Chen Chen, Matou (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 10/176,943

(22) Filed: Jun. 21, 2002

(51) Int. Cl.$^7$ .............................................. H01L 21/44
(52) U.S. Cl. .................. 438/612; 438/637; 438/717
(58) Field of Search ............................... 438/612, 637, 438/717, 618, 620, 622, 624, 638, 723, 4, 734, 78, 740, 743–744, 751

(56) References Cited

U.S. PATENT DOCUMENTS

| | | | |
|---|---|---|---|
| 5,578,517 A | 11/1996 | Yoo et al. | 437/60 |
| 5,985,765 A | 11/1999 | Hsiao et al. | 438/694 |
| 6,054,340 A | 4/2000 | Mitchell et al. | 438/132 |
| 6,162,686 A | 12/2000 | Huang et al. | 438/281 |
| 6,235,557 B1 | 5/2001 | Manley | 438/132 |

*Primary Examiner*—Douglas Wille
*Assistant Examiner*—Ginette Peralta
(74) *Attorney, Agent, or Firm*—Haynes and Boone, LLP

(57) ABSTRACT

A new process flow is provided for the creation of a fuse contact and a bond pad. The invention starts with a semiconductor substrate over the surface of which is provided top level metal and fuse metal in the surface of a layer of insulation deposited over the surface of the substrate. A first etch stop layer is deposited over the surface of the layer of insulation over which a first passivation layer is deposited, an opening is created through these layers exposing the top level metal. A metal plug is created overlying the exposed surface of the top level metal. A stack of a patterned and etched hard mask layers, having been deposited at part of the creation of the metal plug and overlying a layer of metal plug material, remains in place over the surface of the created metal plug. A second layer of passivation material is deposited, the second layer of passivation is patterned and etched exposing the surface of the first layer of passivation overlying the fuse metal and exposing the surface of the stack of hard mask layers overlying the created metal plug. The stack of hard mask layers is then removed from the surface of the metal plug, exposing the surface of the metal plug to serve as a contact pad and further reducing the thickness of the first layer of passivation over the surface of the fuse metal, making the fuse more accessible for fuse blowing.

38 Claims, 8 Drawing Sheets

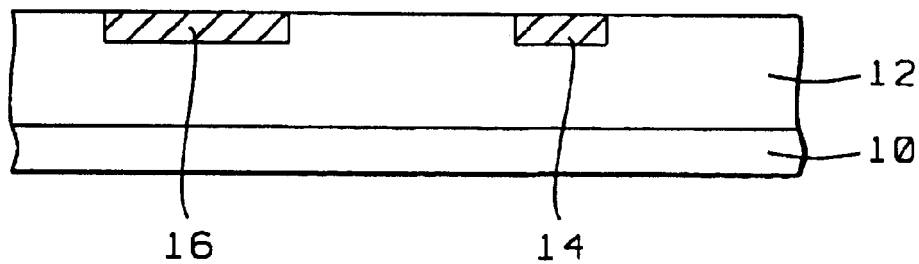
FIG. 1 – Prior Art
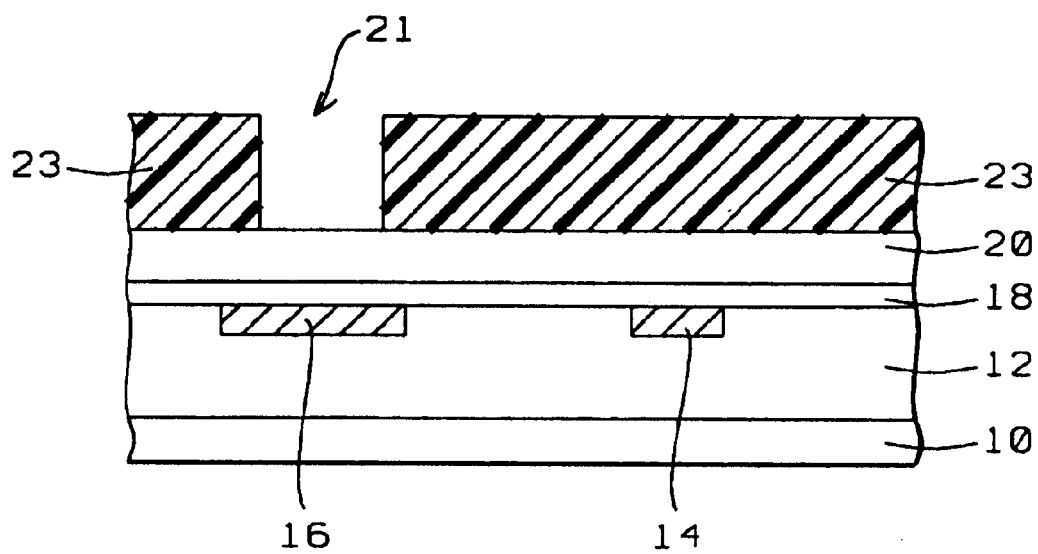
FIG. 2 – Prior Art
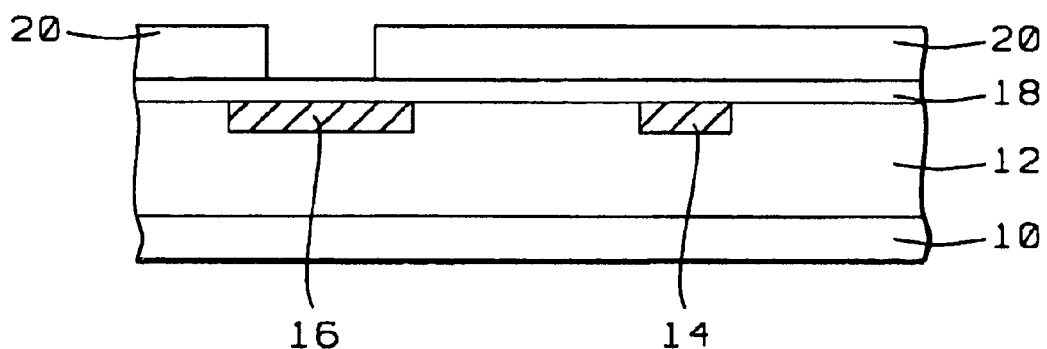
FIG. 3 – Prior Art

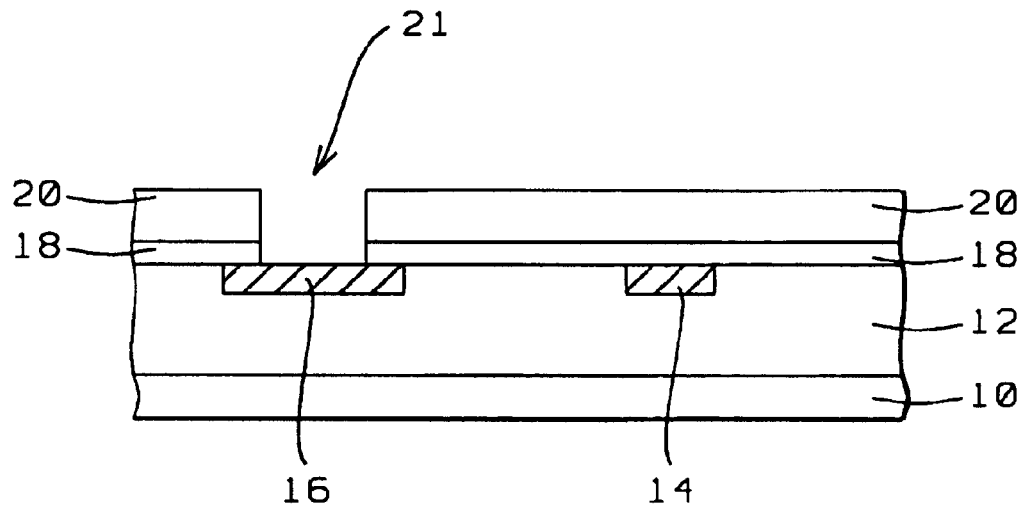
FIG. 4 – Prior Art
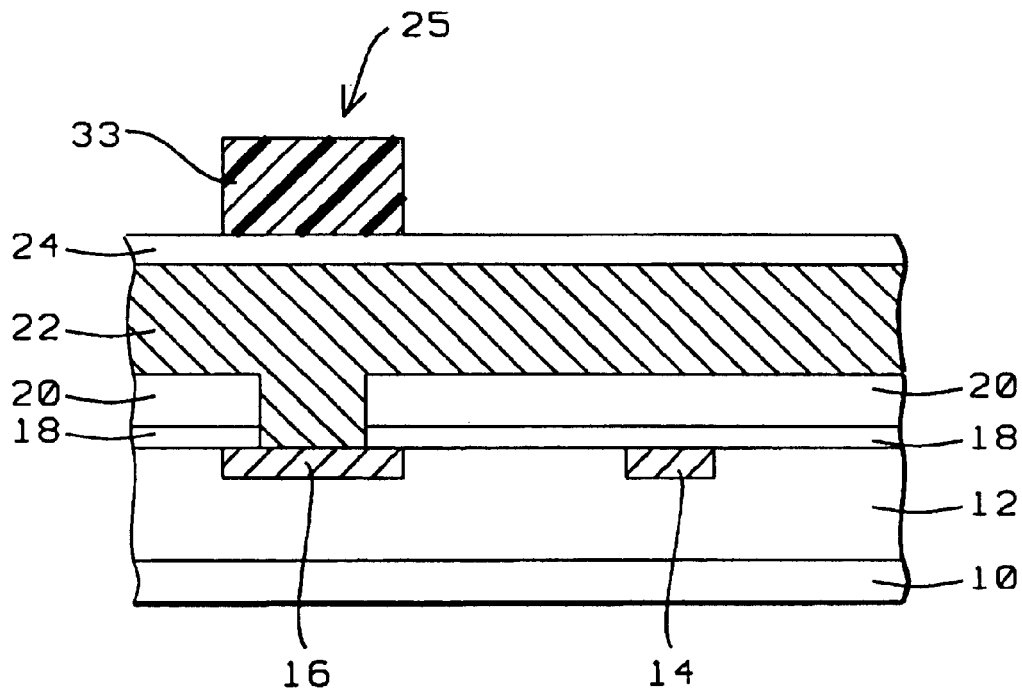
FIG. 5 – Prior Art

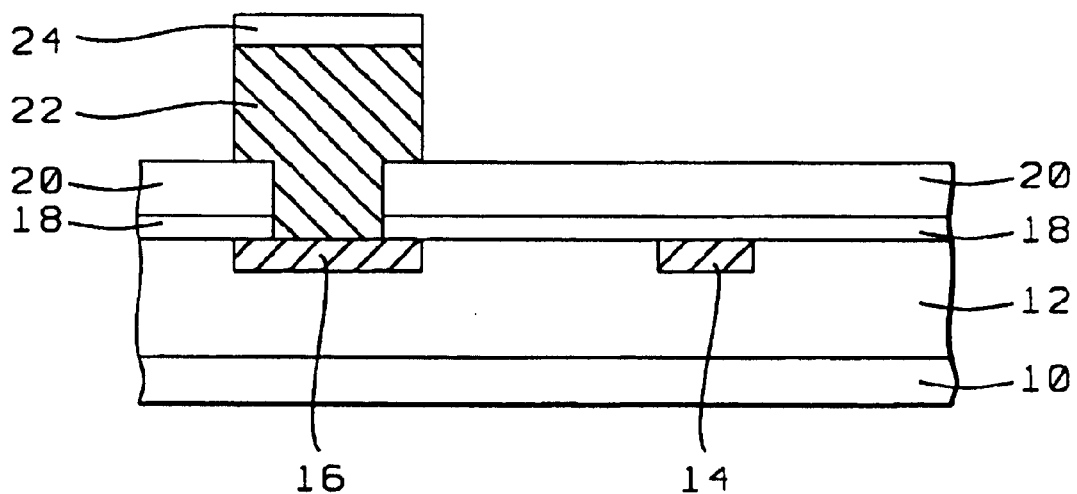
FIG. 6 - Prior Art
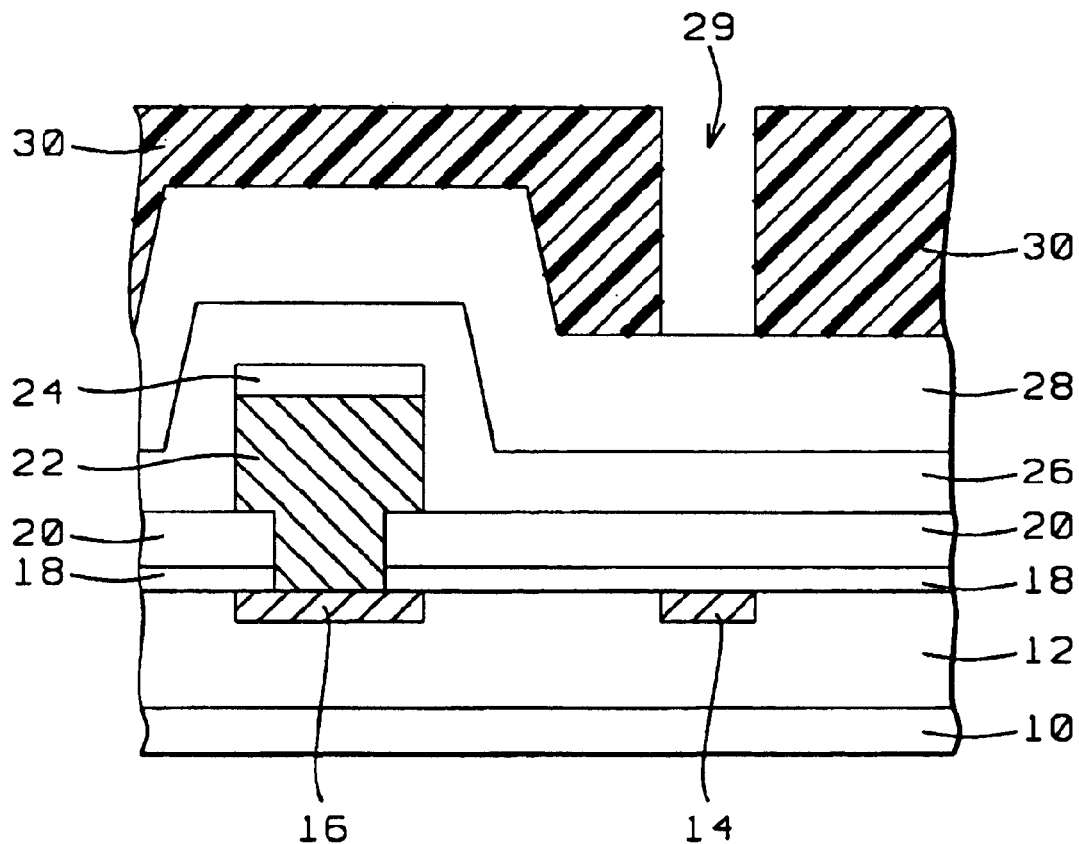
FIG. 7 - Prior Art

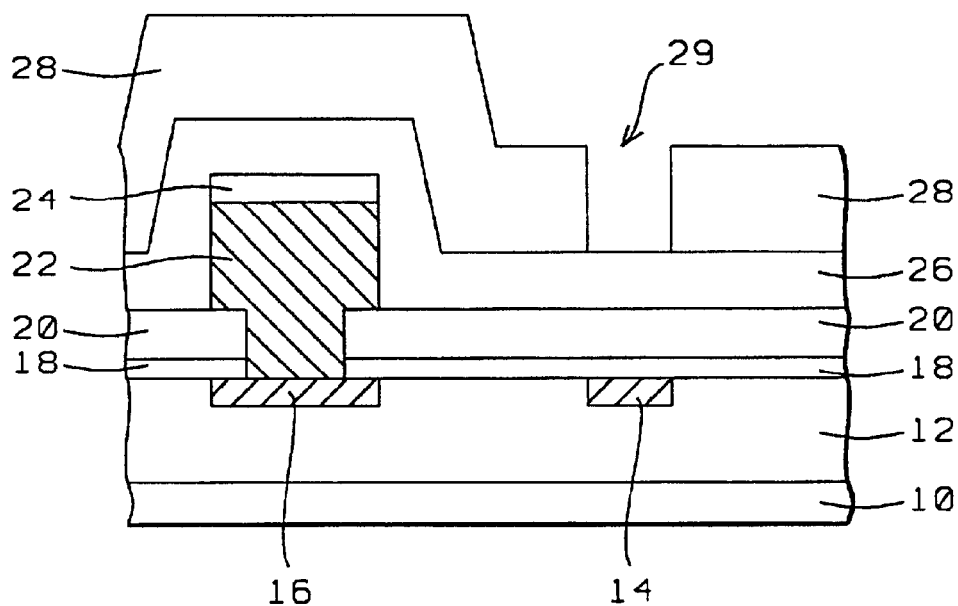
FIG. 8 – Prior Art
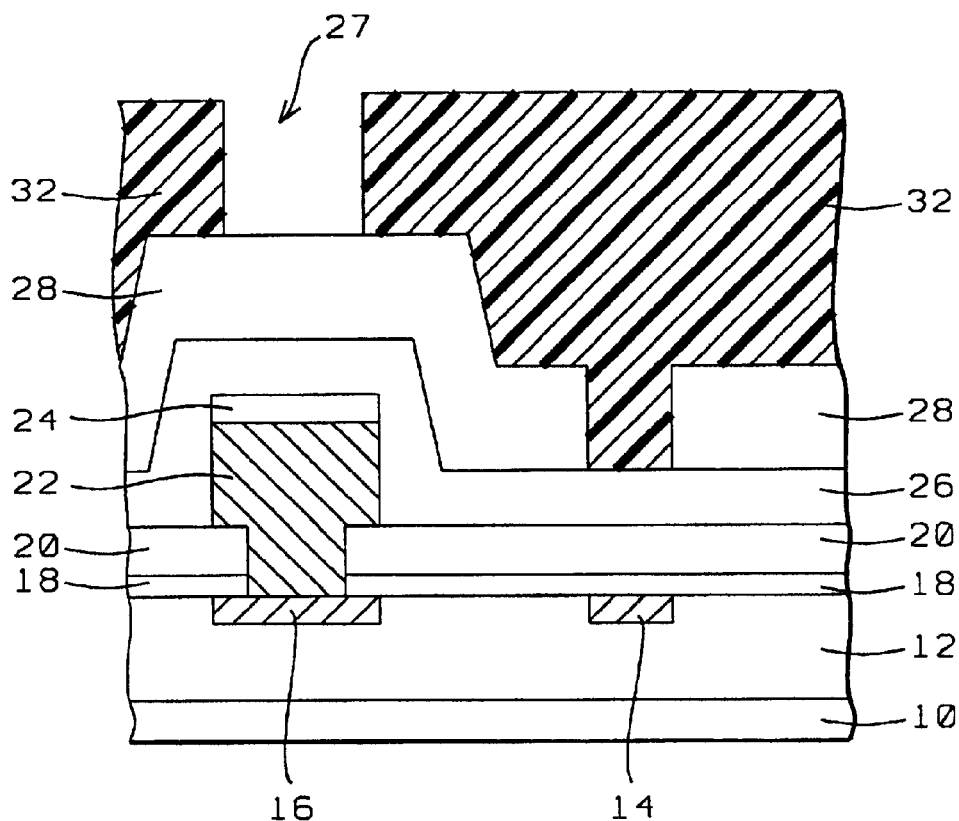
FIG. 9 – Prior Art

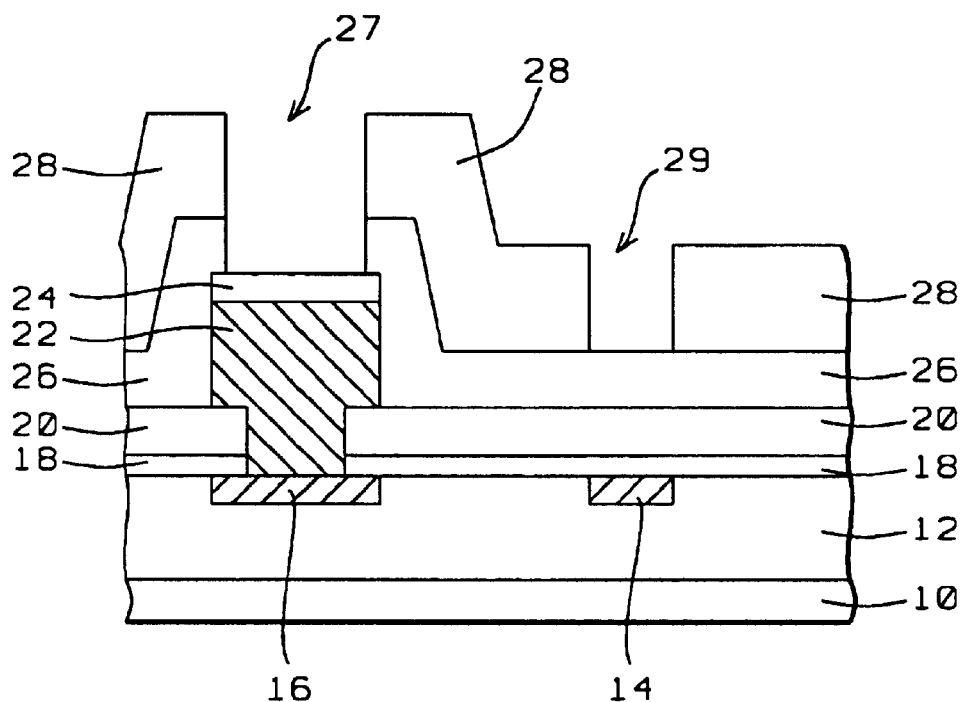
FIG. 10 – Prior Art
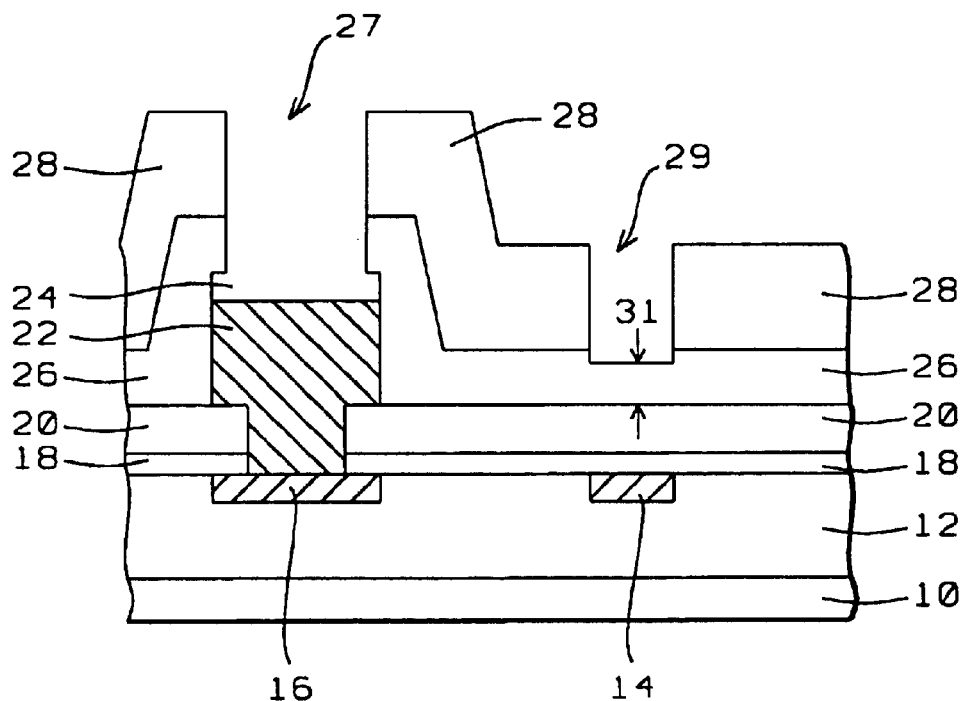
FIG. 11 – Prior Art

US 6,911,386 B1

INTEGRATED PROCESS FOR FUSE OPENING AND PASSIVATION PROCESS FOR CU/LOW-K IMD

BACKGROUND OF THE INVENTION (1) Field of the Invention

The invention relates to the fabrication of integrated circuit devices, and more particularly, to a method for the creation of a reliable top metal fuse.

(2) Description of the Prior Art

Increased semiconductor device performance has over the years been achieved by decreasing device dimensions and by increasing device packaging densities. The therefrom following sharp reductions in device feature size imposes increasingly strict limitations on the technologies that are used for semiconductor device creation. Increasing device density requires the creation of more complex networks of interconnect traces over a surface in which multiple active semiconductor devices have previously been created, a requirement that is typically addressed by increasing the number of overlying layers of electrical interconnect wiring. It is in this respect not uncommon to use from two to six overlying layers of conductive interconnects, these layers of interconnects are embedded in layers of insulating material such as layers of Intra Level Dielectric (ILD) and Inter Metal Dielectric (IMD). After these layers of interconnect have been created, a passivation layer is generally deposited over the surface of the upper layer of insulation for the protection of the underlying semiconductor devices and the network of conductive interconnects.

In addition to the above referred to active semiconductor devices that are provided over for instance the surface of a silicon substrate, semiconductor constructs frequently are also provided with means of further personalizing these devices by providing one or more fuses as part of the device.

With the increased number of overlying layers of insulation and with the reduction in device feature size, the conventional approach of creating a poly fuse, that is accessed via an opening created through the layers of insulation, becomes less attractive and has therefore been replaced with the creation of metal fuses.

Laser technology is typically and most beneficially used for the opening to the fuse for purposes of device personalization. These layers are, aligned with the fuse point of contact, penetrated, creating an opening through these layers that aligns with the fuse point of contact, whereby however a fraction of these layers remains in place over a height above the fuse point of contact. This layer overlying the fuse point of contact has as a design requirement that the layer remains a solid layer of consistent layer density, that is no cracks or other density disturbances are allowed in the fraction of the layer of insulation that remains in place overlying the fuse point of contact. The laser technology that is used for opening (or blowing) the fuse combined with the characteristics of the typically used low-K dielectrics that are used for the layers of insulation, readily and frequently lead to the occurrence of cracks in the remaining overlying layer of insulation, leading to increased product loss.

An additional concern is the complexity of the process that is required in order to create the layers of interconnect traces in combination with electrical fuse capability. It is not uncommon to have a process requiring four steps of photoresist mask processing, each step in addition requiring relatively extensive steps of surface clean after the patterned layers of photoresist have been removed prior to additional processing steps.

Concurrent with the creation of access to a fuse, openings are frequently created through the layers of insulation to a bond pad, which is a point of contact in the surface of the layers of insulating material. The non-exposed surface of the created bond pad remains covered with a layer of insulating material. Good adhesion is required in this interface between the bond pad and the partially overlying layer of insulating material for reasons of device performance of which most notably can be cited requirements of leakage currents from the bond pad to surrounding areas and contact resistance to the bond pad.

The invention addresses these and other concerns by providing a sequence of processing steps for the creation of a fuse opening and a contact pad, also referred to as bond pad, through layers of passivation, whereby negative effects that are typically experienced due to the presence of low-K dielectric overlying the fuse are eliminated.

U.S. Pat. No. 6,162,686 (Huang et al.) shows a fuse opening process and passivation process.

U.S. Pat. No. 5,985,765 (Hsiao et al.) shows integrated BP and fuse process.

U.S. Pat. No. 6,235,557 B1 (Manley) shows a fuse, top metal and passivation process.

U.S. Pat. No. 6,054,340 (Mitchell et al.) discloses another fuse and passivation process.

SUMMARY OF THE INVENTION

A principle objective of the invention is to provide a process flow for the creation of fuse access and access to a bond pad in which the number of photoresist and etching steps is reduced.

Another objective of the invention is to provide a process for the creation of a bond pad opening, whereby bonding between the non-exposed surface of the bond pad and surrounding layers of insulating material is improved.

Yet another objective of the invention is to improve overall semiconductor package reliability in creating fuse access and a bond pad at no additional manufacturing cost incurred by avoiding an increase in the required number of device exposures and the therewith associated use of exposure masks.

In accordance with the objectives of the invention a new process flow is provided for the creation of a fuse contact and a bond pad. The invention starts with a semiconductor substrate over the surface of which semiconductor devices, components and conductive interconnects have been created, including top level metal and fuse metal in the surface of a layer of insulation deposited over the surface of the substrate. A first etch stop layer is deposited over the surface of the layer of insulation over which a first passivation layer is deposited, an opening is created through these layers exposing the top level metal. A metal plug is created overlying the exposed surface of the top level metal. A stack of a patterned and etched hard mask layers, having been deposited at part of the creation of the metal plug and overlying a layer of metal plug material, remains in place over the surface of the created metal plug. A second layer of passivation material is deposited over the surface of the structure, the second layer of passivation is patterned and etched exposing the surface of the first layer of passivation overlying the fuse metal and exposing the surface of the stack of hard mask layers overlying the created metal plug. The stack of hard mask layers is then removed from the surface of the metal plug, exposing the surface of the metal plug to serve as a contact pad and further reducing the thickness of the first layer of passivation over the surface of the fuse metal, making the fuse more accessible for fuse blowing.

BRIEF DESCRIPTION OF THE DRAWINGS

FIGS. 1 through 11 highlight conventional processing steps that are applied for the creation of a contact pad and the creation of an opening to a fuse point, as follows:

FIG. 1 shows a cross section of a semiconductor surface such as the surface of a silicon substrate, a layer of interconnect metal has been created over the surface, a layer of top metal and a layer of metal fuse has been created in the surface of the layer of interconnect metal.

FIG. 2 shows a cross section after deposition of a first layer of etch stop material and a first layer of passivation material. A first photoresist mask has been created.

FIG. 3 shows a cross section after the etch of the first layer of passivation, the first photoresist mask has been removed.

FIG. 4 shows a cross section after the first etch stop layer has been removed from above the pattern of top metal using the patterned and etch first layer of passivation as a mask.

FIG. 5 shows a cross section after a layer of metal, such as a layer of aluminum, has been blanket deposited, a second layer of etch stop material has been deposited over the surface of the layer of metal. A second photoresist mask has been created.

FIG. 6 shows a cross section after the second layer of etch stop material and the layer of metal have been etched in accordance with the second photoresist mask.

FIG. 7 shows a cross section after a second stack of passivation layers have been deposited, comprising a layer of silicon oxide and a layer of silicon nitride. A third photoresist mask has been created.

FIG. 8 shows a cross section after the etch of the fuse opening, the third photoresist mask has been removed.

FIG. 9 shows a cross section after a fourth photoresist mask has been created for the contact pad etch.

FIG. 10 shows a cross section after the etch of the opening to the contact pad, the fourth photoresist mask has been removed.

FIG. 11 shows a cross section after removal of a layer of silicon nitride from the surface of the contact pad.

Figure 12:
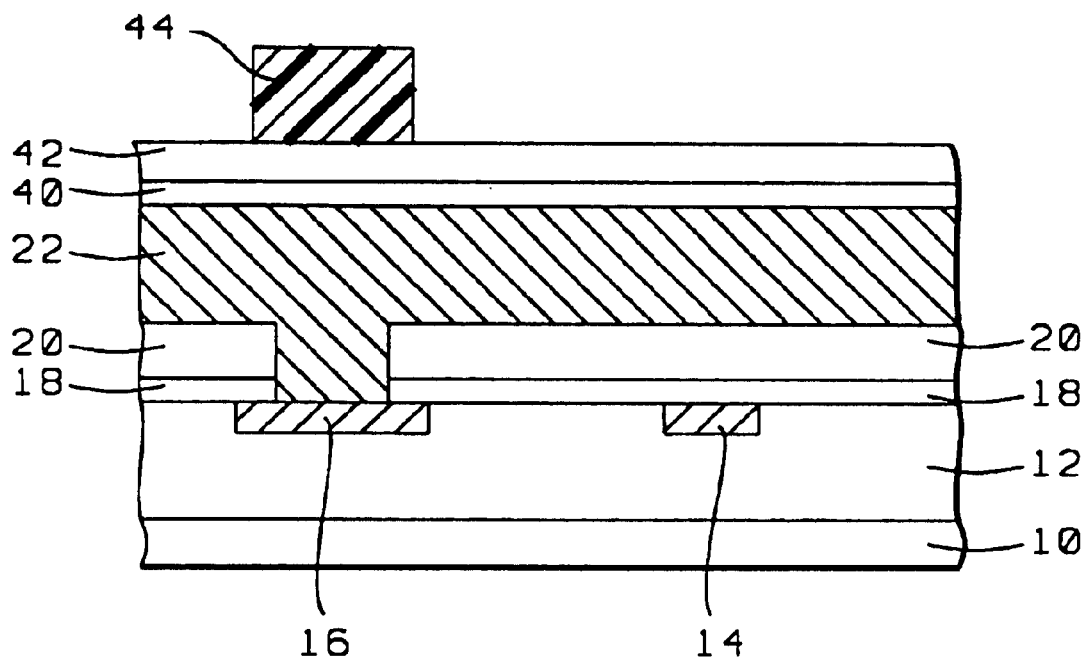

The invention will be explained using the above highlighted FIGS. 1 through 4 in addition to FIGS. 12 through 16, as follows:

FIG. 12 assumes prior creation of a construct following FIGS. 1 through 4, in addition the cross section of FIG. 12 shows the deposition of a layer of metal over which successively is deposited a stack of layers of hard mask material comprising a lower layer of silicon oxynitride and an upper layer of silicon oxide. A second photoresist mask has been formed.

Figure 13:
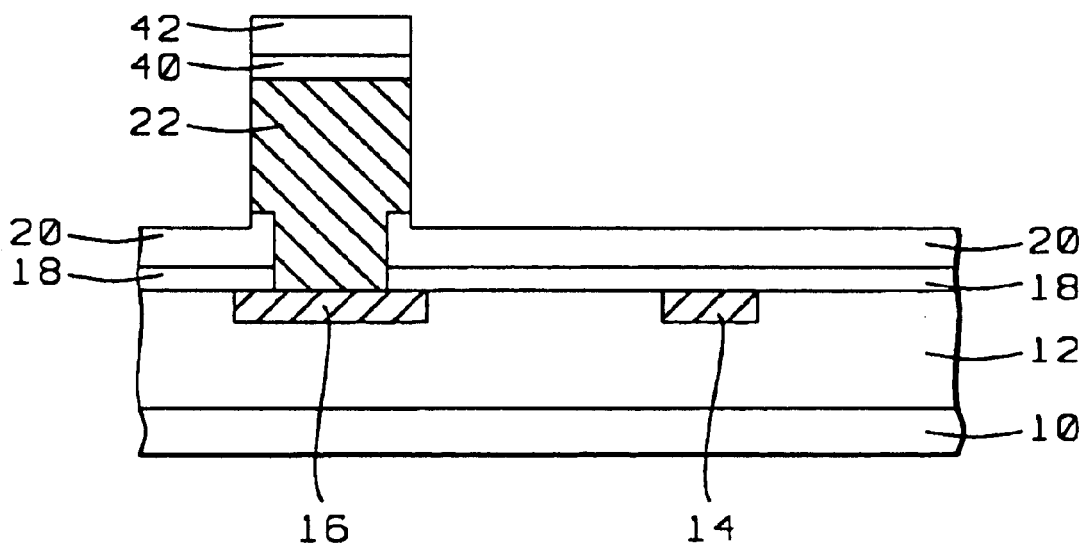

FIG. 13 shows a cross section after the layers of silicon oxide, silicon oxynitride and metal have been etched in accordance with the second photoresist mask, creating a contact pad over which two layers of hard mask material remain in place.

Figure 14:
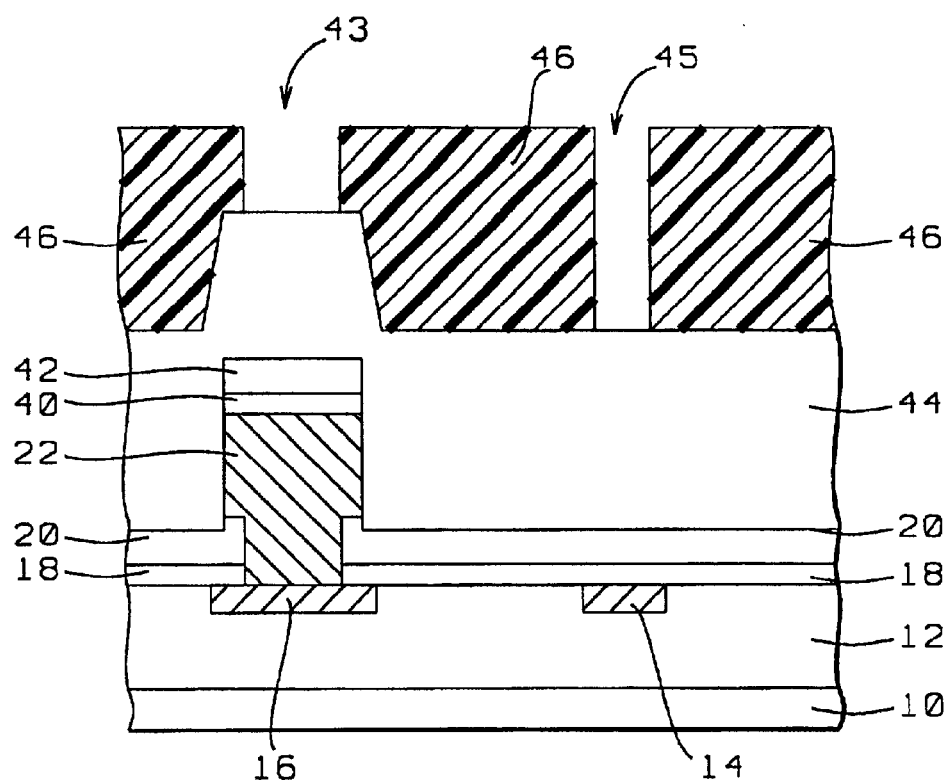

FIG. 14 shows a cross section after deposition of a second layer of passivation, a third photoresist mask has been formed.

Figure 15:
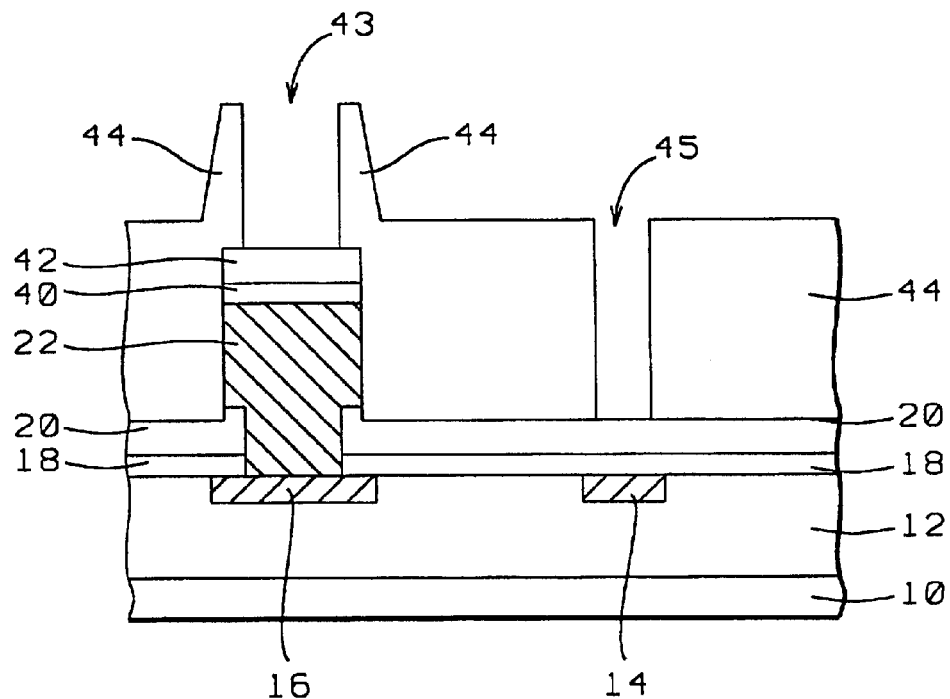

FIG. 15 shows a cross section after the second layer of passivation has been etched in accordance with the pattern of the third photoresist mask.

Figure 16:
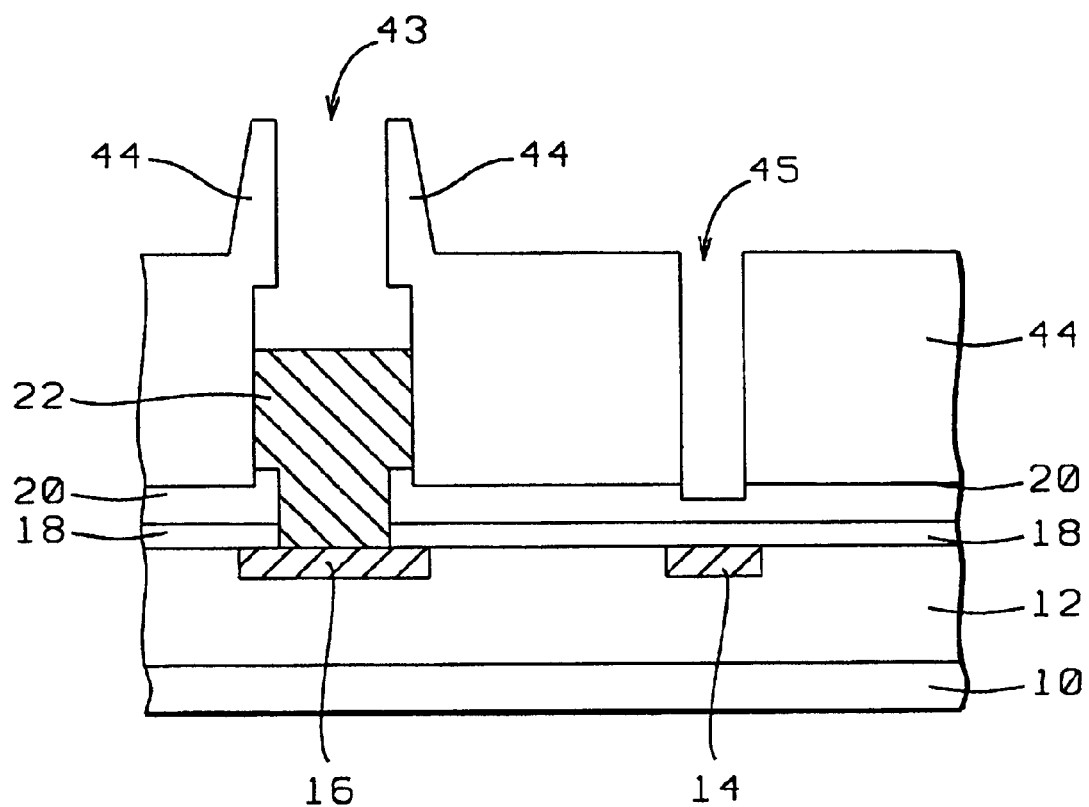

FIG. 16 shows a cross section after the two layers of hard mask material have been removed from the surface of the contact pad.

DESCRIPTION OF THE PREFERRED EMBODIMENTS

In order to enhance an understanding of the invention, a conventional method of creating a contact pad opening combined with creating a fuse opening will first be highlighted. For this purpose, FIGS. 1 through 11 will be used.

Referring now first specifically to FIG. 1, there is shown a cross section of a semiconductor surface 10, typically the surface of a monocrystalline silicon substrate, over which active semiconductor devices (not shown) have been created. Electrical access must be provided to the semiconductor devices that have been created in or over the surface of substrate 10. For this purpose, a layer 12 of conductive interconnect traces has been created whereby this layer may contain one or more overlying and interconnected layers of conductive traces, overlying layers being interconnected with the conventional contact plugs or via interconnects. The details of the interconnect layers that are assumed to be provided in layer 12 are not highlighted in the cross section of FIG. 1 since these details are not germane to the subject description and would therefore only make the subject description less clear.

Of importance to the subject description are the contact points 14 and 16 highlighted in the cross section of FIG. 1. Element 14 represents a contact point to fuse metal while element 16 represents a layer of top metal that establishes contact with the semiconductor devices provided in or over the surface of surface 10 by means of the network of interconnect traces provided in layer 12.

The conventional process now deposits of first layer of etch stop material and a fist layer of passivation over the surface of layer 12.

Layer 18 is a first layer of etch stop layer comprising for instance a layer of silicon nitride, deposited to a thickness of about 750 Angstrom. Layer 20 is a first layer of passivation material, comprising for instance silicon oxide, deposited to a thickness of about 4,000 Angstrom.

As a final layer that is shown in the cross section of FIG. 2 is shown the patterned and developed layer 23 of photoresist, opening 21 created through the layer 23 of photoresist is aligned with the top metal pattern 16. The photoresist mask 23 is required for the removal of the layer 20 from above the surface of metal 16 whereby the first etch stop layer 18 serves as the etch stop.

FIG. 3 shows a cross section after the etch of layer 20 has been completed and after the removal of the photoresist mask 23 (FIG. 2) from the surface of layer 20.

It must be noted from the cross section that is shown in FIG. 3 that the layer 18 of silicon nitride has at this time not yet been etched since this layer has been used as an etch stop layer for the etching of layer 20 of silicon oxide.

By selecting an etch process that has high etch selectively of silicon oxide (of layer 20) over silicon nitride (of layer 18), the results that have been shown in cross section in FIG. 3 can readily be accomplished even though the etch may have affected the thickness of layer 18 overlying the metal pattern 16 to some extent.

This has not been shown in the cross section of FIG. 3 since it is not germane to the subject processing sequence. This becomes further clear from the cross section that is shown in FIG. 4, where the layer 18 of silicon nitride has been etched in accordance with the pattern of opening 21 (FIG. 2), using the patterned layer 20 of silicon oxide as a mask. The surface of the layer 16 of top metal is now exposed.

At this time in the sequence, a thorough cleaning of the exposed surfaces of the structure that is shown in cross section in FIG. 4 is typically performed. In addition, the exposed surface of layer 16 is now prepared for the following step of depositing a layer of metal, comprising for instance aluminum, over the surface thereof. This preparation is aimed at enhancing the adhesion between the surface of layer 16 and the thereover deposited layer of aluminum and is referred to as alloying the surface of layer 16. This alloying can take the form of creating a seed layer over the surface of layer 16, using layer 16 as a lower electrode for the process of electrolysis that is applied for this purpose.

After the surface of layer 16 has been prepared in this manner, a layer 22, FIG. 5, of metal, for instance comprising aluminum, is then deposited, to a thickness of about 12,000 Angstrom, over the surface of layer 20 of silicon oxide, including the exposed surface of layer 16 as shown in cross section in FIG. 5. In addition, a layer 24 of silicon nitride (a second etch stop layer) is deposited over the surface of the layer 22 of metal. The layer 22 is deposited to form a contact pad in contact with the layer 16 of top metal, the layer 24 is used as an etch stop layer for the etch of the contact pad as will be clear from the following processing steps, the layer 24 of silicon nitride is typically deposited to a thickness of about 500 Angstrom.

A final layer shown in the cross section of FIG. 5 is layer 33, this layer is the second photoresist mask of the subject and conventional processing sequence. Layer 33 of photoresist aligns with the previously created opening 21 (FIG. 2) and has a diameter that is about equal to the surface of layer 16 of top metal. Layer 33 is used for the etch of the deposited layers 24 of silicon nitride and 22 aluminum.

The results of this latter etch are shown in the cross section of FIG. 6, after the second photoresist mask 33 has been removed from the surface of layer 24. It is clear from the cross section that is shown in FIG. 6 that a contact pad 22 overlying top metal 16 has now been created.

The conventional process continuous, FIG. 7, continues with:

26, the deposition of a layer 26 of silicon oxide, deposited to a thickness of about 4,000 Angstrom, serving as a first layer of passivation for the second layer of passivation material 28, the deposition of a layer 28 of silicon nitride, deposited to a thickness of about 7,000 Angstrom, serving as a second layer of passivation for the second of layer of passivation material, and 30, the creation of a third photoresist mask, this third photoresist mask having opening 29, which aligns with the fuse metal 14 and has a diameter that is slightly smaller that the pattern of fuse metal 14.

The cross section that is shown in FIG. 8 shows the results of the fuse open etch whereby opening 29 is etched through layer 28, in accordance with photoresist mask 30 as shown in cross section in FIG. 7.

The cross section of FIG. 9 shows the creation of a fourth photoresist mask 32 over the surface of the structure that is shown in the cross section of FIG. 8. This fourth photoresist mask 32 is used for the creation of an opening 27 through the layers 26 and 28 of passivation material in order to access the contact pad 22. The results of this latter etch are shown in cross section in FIG. 10, the fourth photoresist mask 32 has been removed in this cross section after the etch of opening 27 through layers 26 and 28 of passivation material has been completed.

As a final step in the conventional processing sequence that is used to create access to a contact pad and to provide access to fuse metal, the layer 24 of silicon nitride is removed from the surface of the layer 22 of the aluminum contact pad. This removal is accomplished by applying a blanket silicon nitride removal step to the surface of the structure that is shown in cross section in FIG. 10, the results of this blanket silicon nitride removal step are shown in the cross section of FIG. 11.

In the cross section of FIG. 11 is shown that:

layer 24 has been removed from above the surface of layer 22 of aluminum the thickness of layer 26 has been reduced over the bottom of opening 29 to a parameter 31, which represents a thickness of layer 26 where this thickness aligns with fuse metal 14; parameter 31 has a value of about 3,000 Angstrom, the thickness of layer 26 has therefore been reduced by about 1,000 Angstrom from the original thickness due to the blanket silicon nitride removal step that is applied to the surface of the structure shown in cross section in FIG. 10.

In the above highlighted conventional processing sequence, FIGS. 1 through 11, processing conditions and the like as they apply to these processing steps have not been highlighted for reasons of brevity of explanation and for reasons of conventionality of these processing conditions.

The processing steps of the invention will now be described in detail making for this purpose reference to a number of the previously highlighted conventional processing step, that is the conventional processing steps that have been described using FIGS. 1 through 4, after which processing steps that are unique to the invention are described using FIGS. 12 through 16. In order to present a complete sequence of the invention, FIGS. 1 through 4 will be briefly reviewed while additional detail is provided for these processing steps where this detail applies.

The cross section that is shown in FIG. 1 specifically shows:

10, a semiconductor surface, typically the surface of a silicon substrate 12, a layer of conductive interconnect traces created over the surface 10

14, the cross section of a contact point to a fuse, and 16, a layer of top metal that establishes contact with the semiconductor devices provided in or over the surface 10 by means of the network of interconnect traces provided in layer 12.

Details to the layers that are shown in cross section in FIG. 1 have previously been provided and are included at this time by reference thereto.

The cross section that is shown in FIG. 2 is part of the processing sequence of the invention even though this processing step has previously been highlighted as a conventional processing step. Shown in the cross section of FIG. 2 are:

18, a first layer of etch stop material, preferably comprising silicon nitride and preferable deposited to a thickness of about 750 Angstrom 20, a first layer of passivation, preferable comprising silicon oxide and preferably deposited to a thickness of about 8,000 Angstrom; it must be noted that the thickness of layer 20 for the processing sequence of the invention is thicker than the thickness of layer 20 that is shown as part of the conventional processing sequence in FIG. 2; in this conventional processing stream layer 20 is deposited to a thickness of about 4,000 Angstrom; the need for the difference in the thickness of layer 20 that is applied by the invention will become more clear as the description of the processing steps of the invention proceeds.

Layer 18 of silicon nitride ($Si_3N_4$) can be deposited using LPCVD or PECVD procedures at a pressure between about 300 mTorr and 400 mTorr, at a temperature between about 600 and 800 degrees C. The silicon nitride layer 18 can also be using $NH_3$ and $SiH_4$. The silicon nitride layer 18 can also be deposited using LPCVD or PECVD procedures using a reactant gas mixture such as dichlorosilane ($SiCl_2H_2$) and ammonia ($NH_3$)

For many applications a layer 18 of Etch Stop Layer (ESL) material can be selected from the group of materials that comprises a silicon component, for instance dielectrics such as silicon dioxide ("oxide", doped or undoped), silicon oxynitride, silicon carbide (SiC), silicon oxycarbide (SiOC) and silicon nitro carbide (SiNC).

First passivation layer 20 can also be selected from the group consisting of silicon nitride, a phosphosilicate glass, a layer of silicon nitride over a layer of silicon oxide, and a layer of phosphosilicate glass over a layer of silicon oxide. A layer of passivation can be deposited using PECVD technology at a temperature between about 350 and 450 degrees C. with a pressure of between about 2.0 and 2.8 Torr for the duration between about 8 and 12 seconds.

Layer 20, of silicon oxide, FIG. 2, can be etched using photolithographic and RIE procedures using $CHF_3$ and $CF_4$ as etchants.

In the cross section of FIG. 3, the first passivation layer 20 has been etched in accordance with the pattern of the first photoresist mask 23.

In the cross section shown in FIG. 4, the layer 18 of silicon nitride has been etched using the patterned and etched layer 20 as a mask. The layer 18 of silicon nitride can be etched using an anisotropic Reactive Ion Etch (RIE), using $CHF_3$ or $CF_4$—$O_2$—He as an etchant. A silicon nitride layer can also be etched by applying an anisotropic RIE of said silicon nitride layer, using $CHF_3$ or $SF_6$—$O_2$ as an etchant.

The invention now continues with a process flow that is highlighted using FIGS. 12 through 16.

Prior to the processing step that is referred to with the cross section of FIG. 12, the surface of the structure that is shown in cross section in FIG. 4 is thoroughly cleaned.

Removal of impurities from the surface is important because impurities may diffuse into the semiconductor substrate during subsequent high-temperature processing, altering the substrate bulk and surface properties. Some impurities are donor or acceptor dopants, which directly affect device performance characteristics. Other impurities cause surface or bulk defects such as traps, stacking faults or dislocations. Surface contaminants such as organic matter, oil or grease lead to poor film adhesion. The various types of impurities and contaminants must therefore be removed by careful cleaning, such as chemical or ultrasonic cleaning at either initiation of silicon processing and in various appropriate steps during processing to remove loose particulate contaminants. Particulates are bits of matter present on a wafer surface that have easily definable boundaries such as various dusts (atmospheric, silicon and quartz), link, photoresist chunks and bacteria. Particulates are generally removed using a process herein called a cleaning process. Material that is too small to be measurable is herein referenced as 'material', which is generally removed using a polishing process. Subsequent to a cleaning process, treatment with organic solvents, such as trichloroethylene, acetone, p-xylene, methanol and ethanol, is performed to remove organic impurities such as hydrocarbons. A final cleaning includes treatment with several various inorganic chemicals to remove heavy metals, for example. These inorganic chemical mixtures are strong oxidants, which form a thin oxide layer at the wafer surface. This oxide layer is stripped, removing impurities absorbed into the oxide layer.

Referring first specifically to the cross section that is shown in FIG. 12, there are shown the following layers of semiconductor material that have successively been deposited:

22, a layer of metal for the creation of a contact pad therefrom, this layer preferably comprises aluminum, deposited to a thickness of about 6,000 Angstrom; over the layer 22 of aluminum is next deposited 40, a layer of SiON, deposited to a thickness of about 300 Angstrom, being a first layer of a stack of hard mask layers, and 42, a layer of silicon dioxide, deposited over the layer 40 of SiON to a thickness of about 800 Angstrom, being a second and final layer of a stack of hard mask layers.

The creation of a layer 22 of aluminum can use conventional methods of metal rf sputtering at a temperature of about 100 degrees C. using aluminum-copper as source material at a temperature of about 400 degrees C. to a thickness between about 12,000 Angstrom.

The preferred method of the invention for the creation of layer 40 is to deposit a layer of Silicon Oxynitrides (SiON) over the surface of layer 22. Silicon Oxynitrides typically have characteristics that are a combination of both silicon and nitride, the general formula for SiON is $SiO_xN_y(H_z)$. Silicon Oxynitrides are formed by creating $SiH_4$ with $N_2O$ and $NH_3$. In order to form a non-conformal layer of SiON, a practical application uses $SiO_xN_y$ deposited by PECVD with a gas flow between about 1700 and 2300 sccm of He, a gas flow of between about 80 and 120 sccm of $N_2O$, a gas flow of between about 40 and 200 sccm of $SiH_4$, at a temperature of between about 380 and 480 degrees C. and at a pressure between about 5 and 8 Torr. A typical carrier gas for the formation of a layer of $SiO_xN_y$ is N2 or He. A layer 40 of SiON can also be sputter deposited.

Layer 40 and 42 serve, at a later step during the processing sequence of the invention, as a layer of hark mask material that remains in place over the surface of the metal fuse 14. SiON and silicon dioxide are frequently used in the art as hard mask layers directly overlying a semiconductor material such as for instance a polysilicon layer.

Layer 42 of silicon oxide can be formed using monosilane ($SiH_4$) and nitrous oxide ($N_2O$) as a source material deposited using LPCVD or PECVD procedures, at a temperature between about 300 and 800 degrees C. The silicon oxide layer 42 can also be deposited using LPCVD procedures using a reactant gas mixture such as dichlorosilane ($SiCl_2H_2$) and $O_2$.

As a more detailed specification for the creation of layer 42 of silicon oxide can be cited using a PECVD process at a temperature of about 400 degrees C. and a pressure of about 2.8 Torr using $SiH_4$ and $N_2O$ as a source gas for the duration of about 10 seconds with the application of 280 rf watt to the processing chamber whereby layer 42 is deposited to a thickness of about 800 Angstrom.

A final layer that is shown in cross section in FIG. 12 is layer 47, which is a second photoresist mask, whereby as a first photoresist mask has been identified as photoresist mask 23 shown in the cross section of FIG. 2. The second photoresist mask is used for etching layer 42 of silicon dioxide, layer 40 of silicon oxynitride and layer 22 of metal, preferably comprising aluminum.

The results of this latter etch are shown in the cross section of FIG. 13, in addition the second photoresist mask 47 has been removed from the surface of layer 42.

Examples of processing conditions for these various and sequential steps of etch are cited following.

Layer 42 of silicon oxide can be etched by applying an anisotropic Reactive Ion Etch (RIE) of the silicon oxide layer, using $CHF_3$ or $CF_4$—$O_2$—He as an etchant. Layer 40 of SiON can be etched using a SiON removal process with etchant gasses $CH_3F/Ar/O_2$ at a temperature between about 10 and 20 degrees C., a pressure of between about 50 and 60 mTorr with an etch time of between about 40 and 60 seconds. The deposited layer 22 of aluminum can be etched using $Cl_2/Ar$ as an etchant at a temperature between 50 and 200 degrees C., an etchant flow rate of about 20 sccm for the $Cl_2$ and 1000 sccm for the Ar, a pressure between about 50 mTorr and 10 Torr, a time of the etch being time controlled.

It must be noted in the cross section that is shown in FIG. 13 that the thickness of layer 20 has been reduced where this layer is not protected by the second photoresist mask 47. The etch of the layer 22 of aluminum has penetrated layer 20 such that the thickness of layer 20 is reduced from an original value of about 8,000 Angstrom to a thickness of about 6,000 Angstrom. This reduction in thickness is not detrimental to the objectives of the invention but can additionally be used to control the thickness of the layer 20 that remains in place overlying the fuse metal 14. This will become apparent by examining FIG. 16, which is presented as the final cross section of the invention.

The invention continues, as shown in cross section in FIG. 14, by depositing a layer 44 of silicon nitride over the surface of the layer 20, thereby including the exposed surfaces of the contact pad 22 with the thereover deposited and patterned layers 40 of SiON and 42 of silicon nitride. Also shown in the cross section of FIG. 14 is a third photoresist mask 46 that has been formed over the surface of the deposited layer 44 of silicon nitride. The photoresist mask 46 has been patterned and developed whereby openings 43 and 45 have been created through the layer 46 of photoresist. Opening 43 aligns with the contact pad 22 while opening 45 aligns with the fuse metal 14.

Processing conditions for the creation of the layer 44 of silicon nitride have previously been highlighted and will therefore not be repeated at this time.

With the third photoresist mask 46 now in place, layer 44 of silicon nitride in now ready for the creation of, as shown in cross section in FIG. 15:

43, the contact pad opening through the layer 44 of silicon nitride, and 45, the fuse opening through the layer 44 of silicon nitride.

The third photoresist mask 46, FIG. 14, has, in the cross section that is shown in FIG. 15, been removed from the surface of layer 44 of silicon nitride. The photoresist layer can be removed using plasma oxygen ashing and careful wet clean. The oxygen plasma ashing is heating the photoresist in a highly oxidized environment, such as an oxygen plasma, thereby converting the photoresist to an easily removed ash. The oxygen plasma ashing can be followed by a native oxide dip for 90 seconds in a 200:1 diluted solution of hydrofluoric acid.

Processing conditions for the etch of layer 44 of silicon nitride of silicon nitride have previously been highlighted and will therefore not be repeated at this time.

From the cross section that is shown in FIG. 15, it is clear that access to the contact pad 22 must be provided by removing layers 40 of SiON and layer 42 of silicon oxide from above the patterned and etched contact pad 22. This final step of the invention is performed by applying a silicon oxide and a SiON removal step to the surface of the structure that is shown in cross section in FIG. 15, resulting in a structure that is shown in cross section in FIG. 16. It must thereby be noticed that the thickness of the layer 20, where this layer is aligned with the fuse metal 14 and at the bottom of opening 45, is reduced due to the process of applying the silicon oxide and a SiON removal step. The original thickness of about 6,000 Angstrom is now further reduced to about 4,000 Angstrom, thereby providing an additional parameter of control over the thickness of the layer 20 of silicon oxide where this layer overlies the fuse metal 14.

After the structure that is shown in cross section in FIG. 16 has been created, a standard cleaning process is applied to the surface of the structure. Conditions that apply for a standard clean have previously been highlighted as a step that is performed prior to creating the cross section that is shown in FIG. 12, that is after completion of the cross section that is shown in FIG. 4. Additionally, for such a process of cleaning and specifically aimed at removing remaining photoresist from the surface of the created structure, sulfuric acid ($H_2SO_4$) and mixtures of $H_2SO_4$ with other oxidizing agents such as hydrogen peroxide ($H_2O_2$) can be used in stripping photoresist or in cleaning a wafer surface after the photoresist has been stripped by other means. For instance, a frequently used mixture is seven parts $H_2SO_4$ to three parts of 30% $H_2O_2$ or a mixture of 88% sulfuric acid and 12% nitric acid. Wafers to be stripped can be immersed in the mixture at a temperature between about 100 degrees C. and about 150 degrees C. for 5 to 10 minutes and then be subjected to a thorough cleaning with deionized water and dried by dry nitrogen. Inorganic resist strippers, such as the sulfuric acid mixtures, are very effective in the residual free removal of highly postbaked resist. They are more effective than organic strippers and the longer the immersion time, the cleaner and more residue free wafer surface can be obtained.

A brief summary of the invention of creating a fuse and contact pad opening is as follows:

the invention starts with a substrate, the substrate has been provided with a pattern of top level metal and fuse metal over the surface thereof a contact pad is created over the surface of the pattern of top level metal by applying a first and second etch resist mask, the contact pad is surrounded by a first layer of etch stop material over the surface of the substrate over which a first layer of passivation has been deposited, a layer of hardmask material remains in place over the surface of the contact pad a first opening is created overlying the pattern of top level metal and a second opening is created overlying the fuse metal through a second layer of passivation material overlying the first layer of passivation material by applying a third etch resist mask, and the layer of hardmask material is removed from the surface of the contact pad, thereby furthermore reducing a thickness of the first layer of passivation material where the first layer of passivation material overlies the fuse metal.

A more detailed summary of the invention of creating a fuse and contact pad opening is as follows:

the invention starts with a substrate, the substrate has been provided with a pattern of top level metal and fuse metal over the surface thereof a first layer of etch stop material is deposited over the surface of the substrate a first layer of passivation material is deposited over the surface of the first layer of etch stop material the first layer of passivation material is patterned and etched, exposing the surface of the first layer of etch stop material, creating an opening through the first layer of passivation material, the opening being aligned with the pattern of top level metal the first layer of etch stop material is etched, using the patterned and etched first layer of passivation material as a mask, exposing the surface of the pattern of top level metal a layer of contact pad material is deposited over the surface of the first layer of passivation material, thereby including the exposed surface of the pattern of top level metal a layer of hardmask material is deposited over the surface of the layer of contact pad material the layers of hardmask material and the layer of contact pad material are patterned and etched, creating a layer of contact pad material aligned with and in contact with the pattern of top level metal, the layer of hardmask material remains in place over the top surface of the layer of contact pad material, exposing the surface of the first layer of passivation material, thereby furthermore reducing a thickness of the first layer of passivation material by a measurable amount a second layer of passivation material is deposited over the surface of the first layer of passivation material, thereby including exposed surfaces of the patterned and etched layer of contact pad material and hardmask material;

the second layer of passivation is patterned and etched, creating a first opening through the second layer of passivation, the first opening being aligned with the patterned and etched layer of contact pad material, the first opening exposing the surface of the layer of hardmask material remaining in place over the top surface of the layer of contact pad material, further creating a second opening through the layer of passivation, the second opening being aligned with the fuse metal, the second opening exposing the surface of the first layer of passivation material, and the layer of hardmask material is removed from the surface of the patterned and etched layer of contact pad material, thereby furthermore reducing a thickness of the first layer of passivation material where the first layer of passivation material overlies the fuse metal.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method of creating a fuse and contact pad opening, comprising the steps of:
   providing a substrate, said substrate having been provided with a pattern of top level metal and fuse metal;
   creating a contact pad over said pattern of top level metal by applying a first and second etch resist mask, said contact pad being surrounded by a first layer of etch stop material over said substrate over which a first layer of passivation has been deposited, a layer of hardmask material remaining in place over said contact pad, said layer of hardmask material comprising a stack of hardmask layers, thereby providing improved protection to said contact pad during formation thereof;
   creating a first opening overlying said pattern of top level metal and a second opening overlying said fuse metal through a second layer of passivation material overlying said first layer passivation material by applying a third etch resist mask, said creating a first and a second opening comprising depositing and patterning one layer of passivation to which one etch recipe is applied for the creation of said first and second opening therethrough; and
   removing said layer of hardmask material from said contact pad, thereby furthermore reducing a thickness of said first layer of passivation material where said first layer of passivation material overlies said fuse metal.

2. The method of claim 1, said substrate having been provided with active and passive semiconductor components, said active and passive semiconductor components being interconnected with at least one layer of interconnect traces, said pattern of top level metal and fuse metal being electrically connected with said interconnect traces being provided in said at least one layer of interconnect traces.

3. The method of claim 1, said creating a contact pad over said pattern of top level metal comprising the steps of:
   depositing a first layer of etch stop material the substrate;
   depositing a first layer of passivation material over the first layer of etch stop material;
   patterning said first layer of passivation material and said first layer of etch stop material by applying said first etch resist mask, creating an opening through said first layer of passivation material and said first layer of etch stop material, said opening being aligned with said pattern of top level metal;
   depositing a layer of contact pad material over said patterned first layer of passivation material, including said opening created through said first layer of passivation material and said first layer of etch stop material;
   depositing a layer of hardmask material over said layer of contact pad material; and
   patterning said layers of hardmask material and contact pad material by applying said second etch resist mask, creating a column of contact pad material overlying and being in contact with said pattern of top level metal, said layer of hardmask material remaining in place over said column of contact pad material, exposing said first layer of passivation material, thereby furthermore reducing a thickness of said first layer of passivation material.

4. The method of claim 3, said contact pad material comprising aluminum or an alloy thereof.

5. The method of claim 4, said aluminum or an alloy thereof being deposited to a thickness of about 12,000 Angstrom.

6. The method of claim 3, said first layer of passivation comprising silicon dioxide.

7. The method of claim 6, said silicon dioxide being deposited to a thickness of about 8,000 Angstrom.

8. The method of claim 3, said first layer of etch stop material being deposited to a thickness of about 750 Angstrom.

9. The method of claim 3, said layer of hardmask material comprising:
a first layer of hardmask material deposited over said first layer of passivation; and
a second layer of hardmask material deposited over said first layer of hardmask material.

10. The method of claim 9, said first layer of hardmask material comprising silicon oxynitride.

11. The method of claim 10, said silicon oxynitride being deposited to a thickness of about 300 Angstrom.

12. The method of claim 9, said second layer of hardmask material comprising silicon dioxide.

13. The method of claim 12, said silicon dioxide being deposited to a thickness of about 800 Angstrom.

14. The method of claim 3, said first and second etch resist mask comprising photoresist.

15. The method of claim 3, said third etch resist mask comprising photoresist.

16. The method of claim 3, additionally applying a first step of surface clean, said step of surface clean being performed prior to said step of depositing a layer of contact pad material over said patterned first layer of passivation.

17. The method of claim 16, additionally alloying said exposed surface of said pattern of top level metal, said alloying being performed after said first step of applying a step of surface clean.

18. The method of claim 1, said creating a first and a second opening through a second layer of passivation material overlying said first layer of passivation material comprising the steps of:
depositing a second layer of passivation over said first layer of passivation, thereby including said contact pad; and
patterning said second layer of passivation by applying said third etch resist mask.

19. The method of claim 18, said second layer of passivation comprising silicon nitride.

20. The method of claim 19, said silicon nitride being deposited to a thickness of about 8,000 Angstrom.

21. The method of claim 1, additionally applying a second step of surface clean, said second step of surface clean being performed after said step of removing said layer of hardmask material from said patterned layer of contact pad material.

22. A method of creating a fuse and contact pad opening, comprising the steps of:
providing a substrate, said substrate having been provided with a pattern of top level metal and fuse metal;
depositing a first layer of etch stop material over the substrate;
depositing a first layer of passivation material over the first layer of etch stop material;
patterning said first layer of passivation material, exposing said first layer of etch stop material, creating an opening through said first layer of passivation material, said opening being aligned with said pattern of top level metal;
patterning said first layer of etch stop material, using said patterned first layer of passivation material as a mask, exposing said pattern of top level metal;
depositing a layer of contact pad material over said first layer of passivation material, thereby including said exposed surface of said pattern of top level metal;
depositing a layer of hardmask material over said layer of contact pad material, said layer of hardmask material comprising a stack of hardmask layers, thereby providing improved protection to said layer of contact pad material;
patterning said layers of hardmask material and said layer of contact pad material, creating a layer of contact pad material aligned with and in contact with said pattern of top level metal, said layer of hardmask material remaining in place over said layer of contact pad material, exposing said first layer of passivation material, thereby furthermore reducing a thickness of said first layer of passivation material;
depositing a second layer of passivation material over the first layer of passivation material, thereby including said patterned layer of contact pad material and hardmask material, said second layer of passivation material comprising one layer of passivation material of one chemical composition;
creating a first opening through the second layer of passivation, said first opening being aligned with said patterned layer of contact pad material, said first opening exposing said layer of hardmask material remaining in place over said layer of contact pad material, further creating a second opening through the layer of passivation, said second opening being aligned with said fuse metal, said second opening exposing said first layer of passivation material, said creating a first and a second opening comprising application of one etch recipe for the creation of said first and second opening there-through; and
removing said layer of hardmask material from said patterned layer of contact pad material, thereby furthermore reducing a thickness of said first layer of passivation material where said first layer of passivation material overlies said fuse metal.

23. The method of claim 22, additionally applying a first step of surface clean, said step of surface clean being performed after said step of patterning said exposed first layer of etch stop material.

24. The method of claim 23, additionally alloying said exposed surface of said pattern of top level metal, said alloying to occur after said first step of applying a step of surface clean.

25. The method of claim 22, additionally applying a second step of surface clean, said second step of surface clean being performed after said step of removing said layer of hardmask material from said patterned layer of contact pad material.

26. The method of claim 22, said substrate having been provided with active and passive semiconductor components, said active and passive semiconductor components being interconnected with at least one layer of interconnect traces created over said substrate, said pattern of top level metal and fuse metal being electrically connected to said interconnect traces being provided in said at least one layer of interconnect traces created over said substrate.

27. The method of claim 22, said contact pad material comprising aluminum or an alloy thereof.

28. The method of claim 27, said aluminum or an alloy thereof being deposited to a thickness of about 12,000 Angstrom.

29. The method of claim 22, said first layer of passivation material comprising silicon dioxide.

30. The method of claim 29, said silicon dioxide being deposited to a thickness of about 8,000 Angstrom.

31. The method of claim 22, said first layer of etch stop material being deposited to a thickness of about 750 Angstrom.

32. The method of claim 22, said layer of hardmask material comprising:
- a first layer of hardmask material deposited over said layer of contact pad material; and
- a second layer of hardmask material deposited over said first layer of hardmask material.

33. The method of claim 32, said first layer of hardmask material comprising silicon oxynitride.

34. The method of claim 33, said silicon oxynitride being deposited to a thickness of about 300 Angstrom.

35. The method of claim 32, said second layer of hardmask material comprising silicon dioxide.

36. The method of claim 35, said silicon dioxide being deposited to a thickness of about 800 Angstrom.

37. The method of claim 22, said second layer of passivation comprising silicon dioxide.

38. The method of claim 37, said silicon nitride being deposited to a thickness of about 8,000 Angstrom.

* * * * *